United States Patent [19]

Carlton et al.

[11] Patent Number: 4,876,655

[45] Date of Patent: Oct. 24, 1989

[54] METHOD AND APPARATUS FOR EVALUATING JITTER

[75] Inventors: Dale E. Carlton, Portland; Clifford E. Baker, Aloha; Ronald M. Henricksen, Beaverton, all of Oreg.

[73] Assignee: Tektronix, Inc., Beaverton, Oreg.

[21] Appl. No.: 803,186

[22] Filed: Dec. 2, 1985

[51] Int. Cl.$^4$ ............... G06F 15/74; G01D 9/00; G06K 9/46

[52] U.S. Cl. .................. 364/487; 364/555; 346/146; 324/77 A; 382/18

[58] Field of Search ........... 364/487, 550, 551, 554, 364/555, 900 MS File, 178; 377/13, 26; 328/119; 340/52 F; 346/146; 382/18, 51; 358/10, 139, 903; 324/77 A, 77 B

[56] References Cited

U.S. PATENT DOCUMENTS

| | | | |
|---|---|---|---|
| 3,360,723 | 12/1967 | Royce | 364/554 |
| 3,465,247 | 9/1969 | Kubo | 324/77 A |
| 3,657,646 | 4/1972 | Zmyslowski et al. | 324/77 A |
| 4,373,193 | 2/1983 | Haag et al. | 364/900 |
| 4,495,585 | 1/1985 | Buckley | 382/18 |
| 4,606,065 | 8/1986 | Beg et al. | 382/18 |

Primary Examiner—Parshotam S. Lall
Assistant Examiner—Daniel W. Juffernbruch
Attorney, Agent, or Firm—John Smith-Hill

[57] ABSTRACT

The distribution with respect to time of an event defined by the waveform of a repetitive input signal having a magnitude that lies within a predetermined range of values is observed by generating a sample signal at least once during each repetition of the input signal, generating an n-bit digital timing signal representative of the time of occurrence of a sample signal relative to the time of occurrence of the trigger signal, and sampling the repetitive input signal and generating a memory enable signal in the event that the magnitude of the input signal at the time of sampling falls within the predetermined range of values. The memory locations of a memory having $2^n$ separately addressable memory locations are allocated respectively to the $2^n$ possible values of the timing signal, and the contents of a memory location of the memory means are incremented by one unit in the event that a memory enable signal is generated in response to a sample signal that is associated with the timing signal to which the location is allocated.

7 Claims, 2 Drawing Sheets

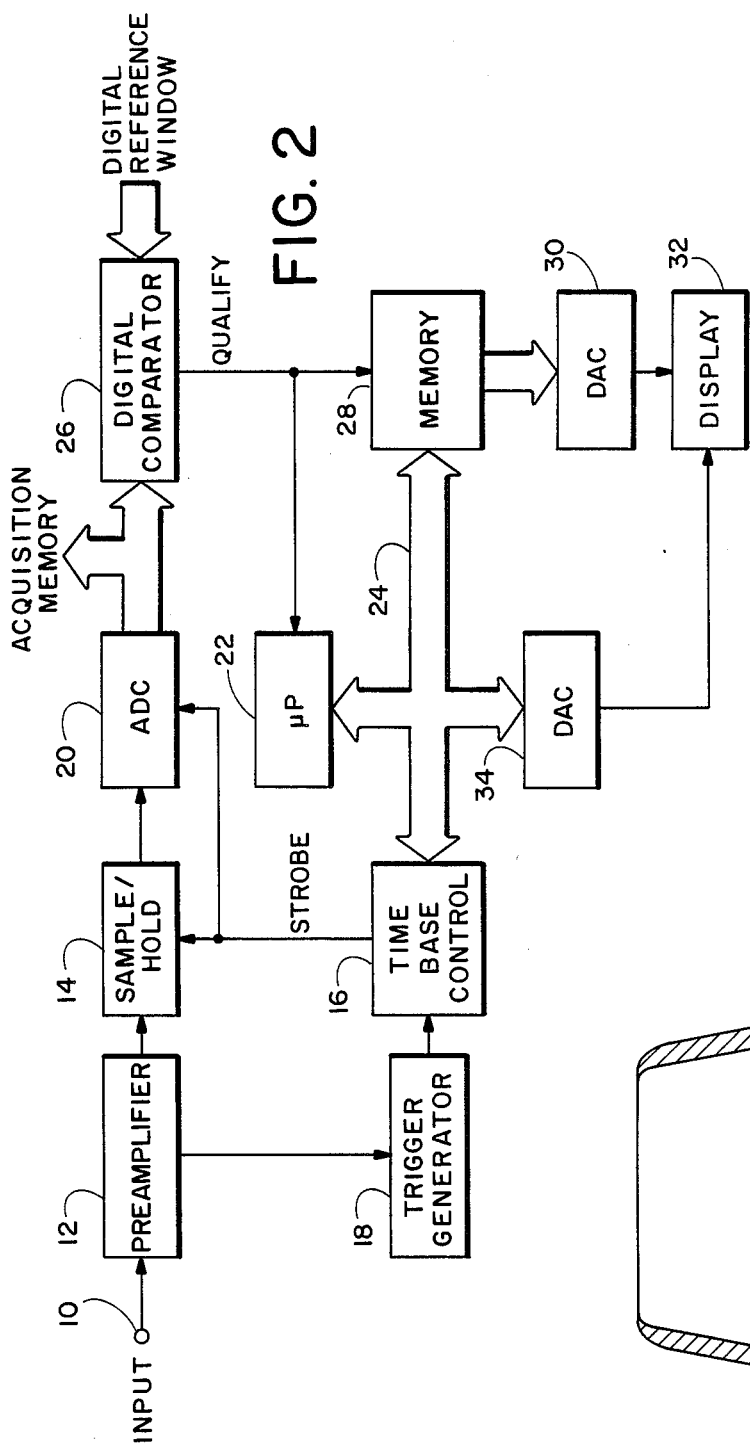

METHOD AND APPARATUS FOR EVALUATING JITTER

This invention relates to a method and apparatus for collecting time-dependent data.

BACKGROUND OF THE INVENTION

A measuring tool that is commonly used in waveform analysis is the oscilloscope, which provides a visual representation of a waveform. A conventional real time oscilloscope provides a continuous but ephemeral representation of a waveform. On the other hand, a digital storage oscilloscope, which samples the waveform and writes the sampled magnitudes into memory, can provide a more enduring display of the waveform by reading the stored magnitude information from memory, converting the stored magnitude information to analog form and using the resulting analog signal to drive the vertical deflection amplifier of the oscilloscope. The samples are taken at predetermined times relative to the time at which the signal magnitude passes through a selected trigger level. Time information, for driving the horizontal deflection amplifier, is derived from the clock signals used for reading the magnitude information from memory.

The conventional digital storage oscilloscope can be used to provide a representation of the waveform of a repetitive signal having components at frequencies that are higher than the sampling frequency, because by taking samples over a large number of repetitions of the signal a sufficient volume of data can be accumulated to provide an accurate display of a single repetition. Known digital storage oscilloscopes also provide means for calculating waveform parameters, such as maximum and minimum magnitude.

An equivalent time sampling system can provide information relating to input signals having frequency components that are higher than the sampling rate. However, the amount of information that can be obtained is limited if the waveform of the input signal is not identical from repetition to repetition. If the waveform of the input signal is not identical from repetition to repetition, the signal has jitter. A displayed waveform has jitter, even if the waveform of the input signal is identical from repetition to repetition, if the trigger level, which determines the time origin for sampling purposes, varies from repetition to repetition.

FIG. 1 illustrates the display that might be provided by a digital storage oscilloscope in response to a repetitive analog signal pulse that has variations in the time at which the first and second transitions occur relative to the trigger point. It will be seen that portions of the waveform representing the first and second transitions are thickened (represented by diagonal hatching in FIG. 1), reducing the accuracy of measurements made on the waveform. It is desirable that the presence of jitter be identified and that the nature of the jitter be evaluated in order to identify the source of the jitter and to compensate for jitter. For example, if a particular feature of the input signal waveform, which should nominally occur at the same time relative to the trigger point, occurs over a band of time values, and the distribution of occurrences has a bell-shaped or Gaussian distribution, this implies that the source of jitter is noise, whereas if the distribution has two or more distinct peaks the implication is that the source of jitter is an error in transforming an analog value into a digital value or that the jitter is non-Gaussian jitter caused by harmonic noise.

SUMMARY OF THE INVENTION

In a preferred embodiment of the present invention, a sample signal is generated in response to a trigger signal at least once during each repetition of a repetitive input signal, and an nbit digital signal representative of the time of occurrence of the sample signal relative to the trigger signal is generated. The repetitive input signal is sampled in response to the sample signal. A memory enable signal is generated if the magnitude of the input signal at the time of sampling falls within a predetermined band of values which is smaller than the dynamic range of the input signal and lies within the dynamic range of the input signal. A memory device has $2^n$ separately addressable memory locations allocated respectively to the $2^n$ possible values of the n-bit digital signal. The contents of a memory location are incremented by one unit if the n-bit digital signal to which the memory location is allocated, is generated and is qualified by a memory enable signal.

BRIEF DESCRIPTION OF THE DRAWINGS

For a better understanding of the invention, and to show how the same may be carried into effect, reference will now be made, by way of example, to the accompanying drawings in which:

FIG. 1 shows a waveform illustrating the effect of jitter,

FIG. 2 is a block diagram of apparatus embodying the present invention,

DETAILED DESCRIPTION

Figure 3A:
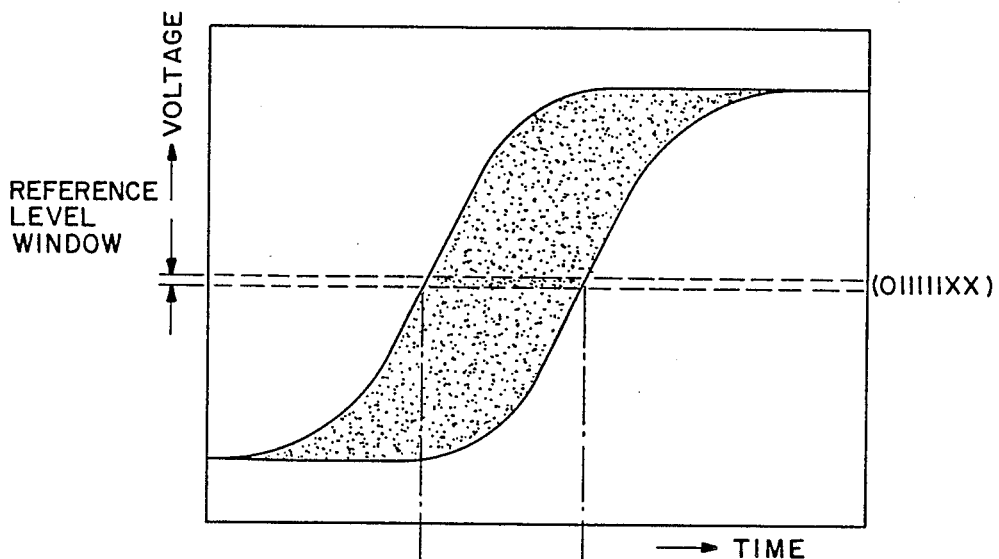
FIG. 3A shows a portion of a waveform.

The apparatus illustrated in FIG. 2 has an input terminal 10 to which a repetitive analog input signal is applied. By way of example, the signal might be a pulse, as shown in FIG. 1, and the first transition of the pulse has the waveform shown in FIG. 3A, where the individual dots represent sample points. The signal is amplified in a preamplifier 12 and is applied both to a sample and hold 14 and to a trigger generator 18. The trigger generator generates a trigger signal at a point on the analog signal that is determined by an internal trigger level control, in the manner of a conventional oscilloscope trigger circuit. The trigger signal is applied to a time base control circuit 16, which applies a strobe pulse to the sample and hold 14. The strobe pulse is generated in response to each occurrence of the trigger signal, and is delayed in relation to the trigger signal by an amount that is determined by a microprocessor 22. An eight bit digital signal representative of the desired amount of delay is generated by the microprocessor 22 and is applied to the time base control circuit 16 over a bus 24. The amount of the delay may vary in random fashion over the period of the input signal, so as to provide incoherent sampling, or it may be an integral multiple of a predetermined minimum delay, so as to provide coherent sampling. The delay signal represents one coordinate of the sample point.

The output signal of the sample and hold 14 is applied to an analog-to-digital converter (ADC) 20, which also receives the strobe pulse from the time base control circuit 16. The sample and hold samples the analog signal provided by the preamplifier 12 at the sample time determined by the microprocessor, and applies the resulting signal, the amplitude of which is representative of the amplitude of the analog input signal at the sample time, to the ADC 20. The ADC 20 generates a digital output signal representative of the amplitude of its input signal. This digital signal, which represents the other coordinate of the sample point, is applied to a digital comparator 26, such as a conventional word recognizer, and may also be applied to an acquisition memory. The comparator 26 receives a digital reference signal from an external source. The reference signal represents a range of possible values of the analog signal applied to the sample and hold. For example, if the digital reference signal is fully defined, the range of values corresponds to one LSB of the digital output signal provided by the ADC 20. If the comparator LSB is a "don't care" digit, the reference level window represents two LSBs of the output signal of the ADC. If the output signal of the ADC 20 lies within the window defined by the comparator, the comparator provides a "qualify" signal to the microprocessor 22.

Figure 3B:
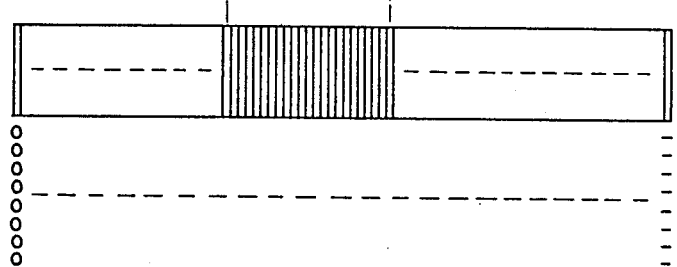
FIG. 3B represents the allocation of memory locations to time intervals over the waveform portion shown in FIG. 3A.

The bus 24, over which the microprocessor 22 applies the delay signal to the time base control circuit, is also connected to a random access memory 28. The memory 28 has 256 addressable locations. As shown in FIG. 3B, these 256 addressable locations are allocated respectively to 256 possible intervals within which samples might be taken. On receipt of the "qualify" signal, the microprocessor 22 enters an increment routine. The microprocessor reads from the memory 28 the contents of the memory location that is allocated to the value of the digital delay signal that gave rise to the "qualify" signal. The microprocessor updates the contents of that location by adding one unit, and writes the updated contents back into the same memory location.

Figure 3C:
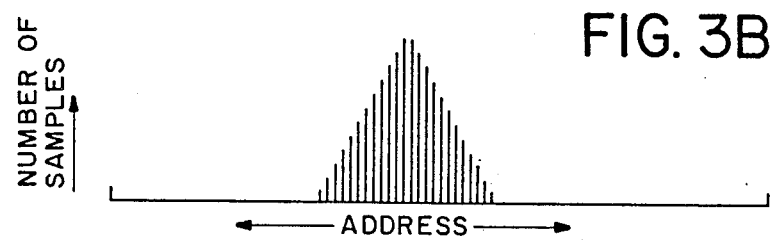
FIG. 3C is a histogram.

If the FIG. 2 apparatus is used to measure the jitter of the pulse having the waveform shown in FIG. 1, the window defined by the reference signal would lie between the base and top magnitudes of the repetitive input signal, and the range of time values represented by the digital signal provided by the microprocessor to the time base control circuit 16 would be selected so as to define a time window which brackets all expected occurrences of the event defined by the statement "The magnitude of the first transition lies within the reference level window". When sampling is completed, the contents of the memory 28 will represent the distribution with respect to time (relative to the trigger point) of the event defined by the above statement. The contents of the memory 28 may be analyzed numerically to determine the mean time and the standard deviation and to identify modes. Alternatively, or in addition, the contents of the memory 28 may be used to provide a histogram display, as shown in FIG. 3C, on a CRT 32. In order to provide this display, the microprocessor 22 reads the accumulated data from the memory 28, the address signal being converted to analog form by a digital-to-analog converter (DAC) 34 and the data signal being converted synchronously to analog form by a DAC 30, and the output signals of the DACs 30 and 34 are used to drive the vertical and horizontal deflection circuits of the CRT 32. The envelope of the histogram may be displayed together with the equivalent time waveform of the pulse by time sharing read-out of data from the memory 28 and the acquisition memory. The peak of the histogram then represents approximately the average time of occurrence, relative to the trigger point, of the event defined by the above statement.

The distribution of the event defined by the reference level window is representative of both signal jitter and measurement system jitter. Measurement system jitter might arise from fluctuation in trigger level. Measurement system jitter can be measured by forming a histogram using an input signal that is known to be free of jitter, and then the jitter of a signal having unknown jitter can be measured by subtracting the measurement system jitter from the combined signal plus system jitter.

It will be appreciated that the invention is not restricted to the particular apparatus and method that have been described with reference to the drawings, and that variations may be made therein without departing from the scope of the invention as defined in the appended claims, and equivalents thereof. For example, the concept of incrementing the contents of a location of the memory by one unit is intended to cover the possibility of decrementing by one unit the contents of a location of a fully-loaded memory. Also, the invention is not restricted to the reference level window being defined by one or two bits of the reference signal, since the size of the window may be enlarged if a reduction in resolution and an increase in measurement time can be tolerated. If it is desired to measure the distribution with respect to time of the occurrence of a peak in the waveform, the reference level window may be open-ended.

What is claimed is:

1. Apparatus for observing the distribution with respect to time of an event defined by the magnitude of a repetitive input signal being within a predetermined band of values which is smaller than the dynamic range of the input signal, comprising:

trigger means responsive to the input signal for generating a trigger signal at a selected trigger point during each repetition of the input signal, means for generating an n-bit digital timing signal, timing means response to the trigger signal and the timing signal for generating a sample signal during each repetition of the input signal at a time that follows the time of occurrence of the trigger signal by an interval that depends on the timing signal, sampling and comparison means responsive to the sample signal for sampling the repetitive input signal and generating a memory enable signal if the sampled magnitude of the input signal falls within said predetermined band of values, memory means having $2^n$ separately addressable memory locations corresponding respectively to the $2^n$ possible values of said timing signal, and control means for causing the contents of a memory location of the memory means to be incremented by one unit if the sampling and comparison means generate a memory enable signal in response to a sample signal that is associated with the timing signal value to which the location corresponds.

2. Apparatus according to claim 1, wherein the sampling and comparison means comprise sampling means responsive to said sample signal for generating a signal representative of the magnitude of the input signal at the time of occurrence of a sample signal and comparison means for generating said memory enable signal if a signal generated by the sampling means falls within said predetermined range of values.

3. Apparatus according to claim 2, wherein the sampling means comprise a sample and hold for providing an analog signal representative of the magnitude of the input signal at the time of occurrence of the sample signal, and an analog-to-digital converter for converting said analog signal to digital form.

4. Apparatus according to claim 3, wherein the comparison means comprise a digital comparator which has first and second inputs for receiving first and second digital values respectively and is operative to generate a memory enable signal if the first digital value bears a predetermined relationship to the second digital value, and the analog-to-digital converter has an output which is connected to the first input of the comparator.

5. Apparatus according to claim 2, wherein the comparison means comprise a digital comparator defining a closed range of values.

6. A method of collecting data representative of the distribution with respect to time of an event defined by the magnitude of a repetitive input signal being within a predetermined band of values which is smaller than the dynamic range of the input signal, comprising:
    (a) generating a trigger signal at a selected trigger point during each repetition of the input signal,
    (b) generating an n-bit digital timing signal,
    (c) generating a sample signal during each repetition of the input signal at a time that follows the time of occurrence of the trigger signal by an interval that depends on the timing signal,
    (d) responding to the sample signal by sampling the repetitive input signal,
    (e) generating a memory enable signal if the sampled magnitude of the input signal falls within said predetermined band of values, and
    (f) incrementing by one unit the contents of a memory location of a memory having $2^n$ separately addressable memory locations corresponding respectively to the $2^n$ possible values of said timing signal, if a memory enable signal is generated in response to a sample signal that is associated with the timing signal value to which the location corresponds.

7. A method according to claim 6, wherein step (e) comprises:
    (i) digitizing the sample generated in step (d) to generate a first digital value,
    (ii) comparing the first digital value with a second digital value, which defines said predetermined range of values, and
    (iii) generating said memory enable signal if the first digital value bears a predetermined relationship to the second digital value.

* * * * *